United States Patent
Tseng et al.

[11] Patent Number: 5,920,783
[45] Date of Patent: Jul. 6, 1999

[54] METHOD OF FABRICATING A SELF-ALIGNED SILICIDE MOSFET

[75] Inventors: H. C. Tseng, Hsinchu; Kun-Cho Chen, Taichung Hsien; Heng-Sheng Huang, Taipei, all of Taiwan

[73] Assignee: United Microelectronics Corp., Hsin-Chu, Taiwan

[21] Appl. No.: 09/055,692

[22] Filed: Apr. 6, 1998

[30] Foreign Application Priority Data

Feb. 7, 1998 [TW] Taiwan ................................ 87101624

[51] Int. Cl.⁶ ................... H01L 21/336; H01L 21/4763; H01L 21/3205
[52] U.S. Cl. ........................... 438/305; 438/592; 257/413
[58] Field of Search ................... 438/592, 305; 257/413

[56] References Cited

U.S. PATENT DOCUMENTS

| | | |
|---|---|---|
| 4,925,807 | 5/1990 | Yoshikawa . |
| 5,102,815 | 4/1992 | Sanchez . |
| 5,583,067 | 12/1996 | Sanchez . |
| 5,766,969 | 6/1998 | Fulford, Jr. et al. . |
| 5,770,507 | 6/1998 | Chen et al. ............... 438/305 |
| 5,783,475 | 7/1998 | Ramaswami ............. 438/303 |
| 5,783,479 | 7/1998 | Lin et al. .................. 438/592 |

*Primary Examiner*—Richard A. Booth
*Attorney, Agent, or Firm*—Knobbe,Martens,Olson&Bear LLP.

[57] ABSTRACT

A method of fabricating a MOSFET device in accordance with the present invention can protect the device from the short channel effect and decrease the resistance of a gate of the device. The fabricating method includes the following steps. A device including a substrate, an oxide layer, a gate and a lightly doped region is provided, wherein the oxide layer is formed on the substrate and the gate is formed on the oxide layer. A conducting layer is formed on the oxide layer, and the conducting layer is etched to form a first spacer. Then, the device is implanted to form a heavily doped region. A dielectric layer is deposited on the device, and the dielectric layer is etched to form a second spacer. The oxide layer is etched to expose part of the side walls of the gate. Then, a self-aligned silicide is further processed to complete the fabricating processes. As a result, the MOSFET device has an ultra-shallow junction under the first spacer to reduce the source/drain resistance and increase the operating rate of the device.

24 Claims, 6 Drawing Sheets

METHOD OF FABRICATING A SELF-ALIGNED SILICIDE MOSFET

CROSS-REFERENCE TO RELATED APPLICATION

This application claims the priority benefit of Taiwan application serial no. 87101624, filed Feb. 7, 1998, the full disclosure of which is incorporated herein by reference.

BACKGROUND OF THE INVENTION

1. Field of the Invention

The invention relates in general to a fabrication of a MOSFET (metal oxide semiconductor field effect transistor) device, and more particularly to a reverse T-gate MOSFET device.

2. Description of the Related Art

When the semiconductor device becomes smaller, the operating rate is raised and the channel length is shortened. The channel length of the MOSFET can not be shortened limitlessly. When the channel length of the MOSFET is shortened to a certain degree, the short channel length causes many problems. This is called a short channel effect. For example, if the threshold voltage Vt decreases, then it becomes difficult to apply a proper gate voltage Vg. When the channel length of the MOSFET is shortened, and the voltage applied to the gate is the same, the transverse electric field will increase. By the accelerating of the electric field, the electrons in the channel have a higher energy. In particular, the electrons in the region close to the junction of the channel and the drain possess much more energy and are called "hot electrons". When the hot electrons bump the electrons in the valence band, the electrons in the valence band go to the conduction band. Then, the electron-hole pair generates the "carrier multiplication" effect. If the "carrier multiplication" effect is serious, it will result in electrical breakdown.

In addition, the increase of the ICs' integrity will cause the junction depth of the source and the drain to be shortened. As a result, the distribution and profile of the semiconductor is difficult to control accurately. The channel effect of ions implantation causes depth control to be difficult. The channel effect of ions implantation will cause an over-implanting depth and result in a damage of the device.

In order to increase the ICs' integrity and to keep a better product quality of a 0.25 μm or lower channel, the resistance of the polysilicon should be lowered to increase the speed of the device. Besides, the junction depth should be lowered to prevent the device from having the channel effect. FIGS. 1A to 1F are cross-sectional views of conventional schematic processes of forming a MOSFET device.

Referring to FIG. 1A, a device includes a substrate 100, a gate oxide layer 102 and a gate 104, wherein the gate oxide layer 102 is formed on the substrate 100, and the gate 104 is formed on the gate oxide layer 102. A liner oxide layer 106 is formed on the device. Then, the substrate is implanted to form a lightly doped region 108.

Referring to FIG. 1B, a dielectric layer 110 is formed on the device. Then, the dielectric layer 110 and the liner oxide layer 106 are etched to become a liner oxide layer 106a and a spacer 110a. Next, the substrate 100 is implanted to form a heavily doped region 112. As shown in FIG. 1C, the lightly doped region 108 and the heavily doped region 112 form a lightly doped drain (LDD) structure.

Referring to FIG. 1D, a titanium layer 114 is formed on the device. Then, a self-aligned silicide process is performed on the contact surface of the titanium layer 114 and the gate 104 with the substrate 100 by annealing to form a titanium silicide layer 116 as shown in FIG. 1E. Referring to FIG. 1F, the remainder of the titanium layer 114 is removed to complete the fabrication of the self-aligned silicide.

In the conventional processes, the distance between the lightly doped region and the titanium silicide layer is small. As a result, current leakage occurs. The current leakage will be especially serious when a voltage is applied to the gate. This is the so-called gate-induced dual leakage. In order to generate a better drain current $I_D$, the lightly doped region can be further implanted to form a heavily doped region. The current technology of implantation is unable to implant the ions in the correct region. If the heavily doped region is formed, the large junction capacitance in the lightly doped region and the channel will cause the short channel effect. In addition, the small contact area of the silicide on the gate will have a low operating rate and a hot carrier effect.

SUMMARY OF THE INVENTION

It is therefore an object of the invention to provide a reverse T-gate MOSFET device. The T-gate device possesses a wide, shallow junction to protect the device from the short channel effect. In accordance with the present invention, increasing the contact area of the gate and the self-aligned silicide layer can reduce the resistance of the gate and increase the operating rate of the device.

The invention achieves the above-identified objects by providing a new method of fabricating a MOSFET device. The MOSFET device can increase the operating rate of the ICs, and protect the device from the short channel effect. The fabricating method includes the following steps. A device including a substrate, an oxide layer, a gate and a lightly doped region is provided, wherein the oxide layer is formed on the substrate and the gate is formed on the oxide layer. A conducting layer is formed on the oxide layer and the conducting layer is etched to form a first spacer. Then, the device is implanted to form a heavily doped region. A dielectric layer is deposited on the device, and the dielectric layer is etched to form a second spacer. The oxide layer is etched to expose part of the side walls of the gate. Then, a self-aligned silicide process is further processed to complete the fabricating processes. The device includes at least the following structures: a substrate, a gate, two source/drain regions, an oxide layer with a first structure and a second structure, a first spacer, a second spacers and a self-aligned silicide layer. The gate is formed on the substrate. The source/drain regions include a lightly doped region and a heavily doped region, wherein the source/drain regions are formed in the substrate and at the sides of the gate. The first structure of the oxide layer is at the side walls of the gate, wherein the top of the first structure is lower than the top of the gate. The second structure of the oxide layer is formed on the substrate, wherein the second structure is connected to the bottom of the first structure. The first spacer is formed on the second structure and at the sides of the first structure. The second spacer is formed on the second structure and at the sides of the first spacer. The self-aligned silicide layer is formed on the gate, the first spacer and over the substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

| 100, 200: | substrate | 102, 202: | gate oxide layer |
| --- | --- | --- | --- |
| 104, 204: | gate | 106, 206: | liner oxide layer |
| 106a: | liner oxide layer after etching | | |
| 108, 208: | lightly doped region | | |
| 110, 214: | dielectric layer | 110a: | spacer |
| 112, 212: | heavily doped region | | |
| 114, 216: | titanium layer | 116, 218: | titanium silicide layer |
| 206a: | first structure | 206b: | second structure |
| 210: | conducting layer | 210a: | first spacer |
| 214a: | second spacer | | |

DESCRIPTION OF THE PREFERRED EMBODIMENT

In accordance with the preferred embodiment of the present invention, a MOSFET device with a shallow junction is provided to protect the device from the short channel effect. In addition, the resistance of the polysilicon gate is reduced by increasing the contact area of the polycide and the self-aligned silicide. FIGS. 2A to 2J are cross-sectional views showing the process steps of one preferred embodiment of fabricating the semiconductor device.

Figure 1A:
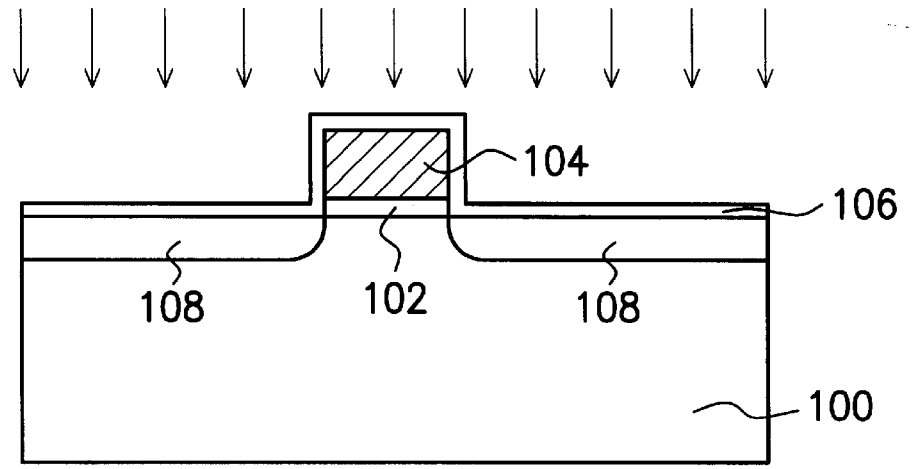
FIGS. 1A to 1F (Prior Art) are cross-sectional views showing a conventional process steps of forming a MOSFET device.
Figure 1B:
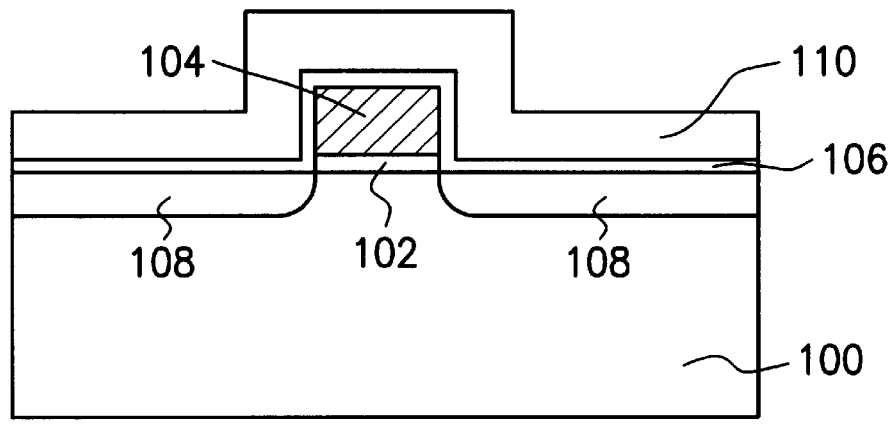
Figure 1C:
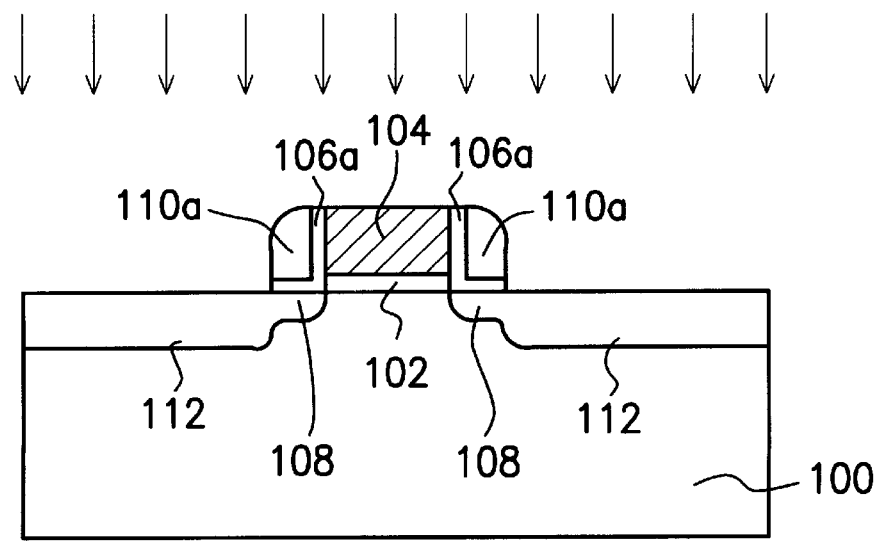
Figure 1D:
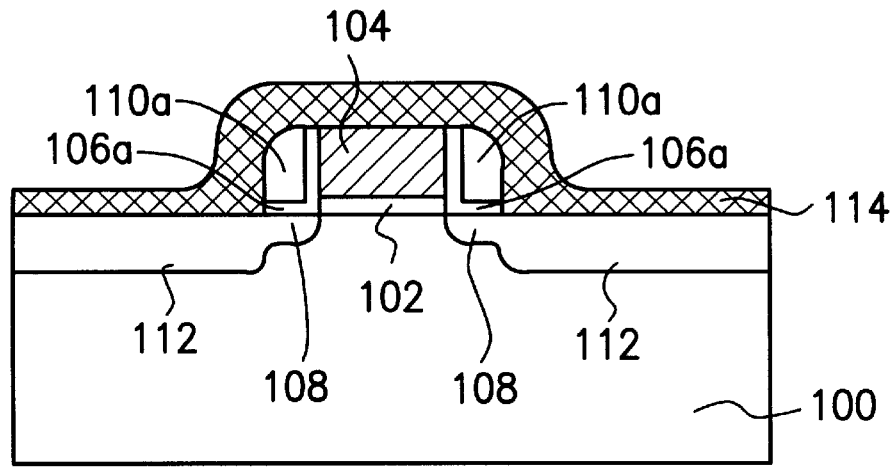
Figure 1E:
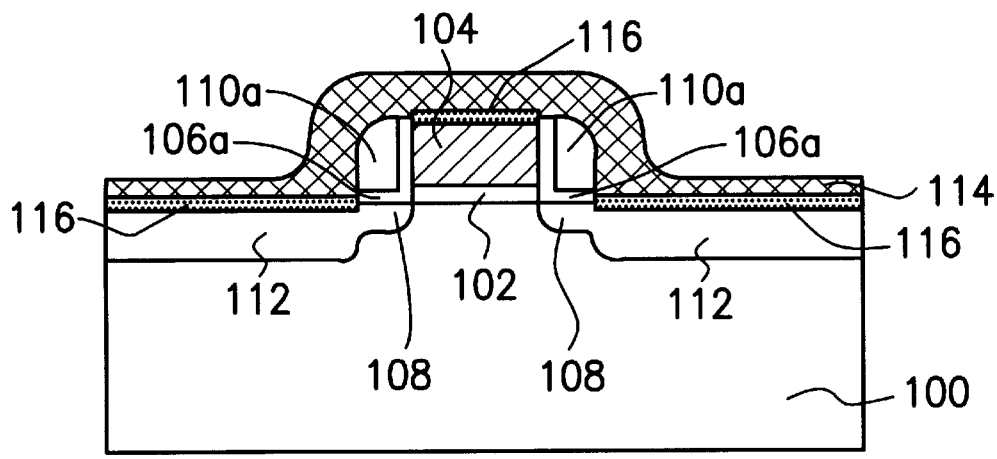
Figure 1F:
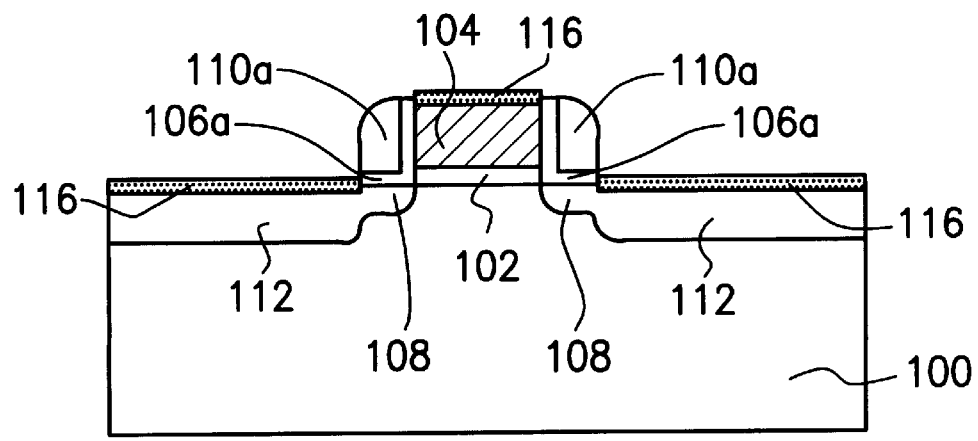
Figure 2A:
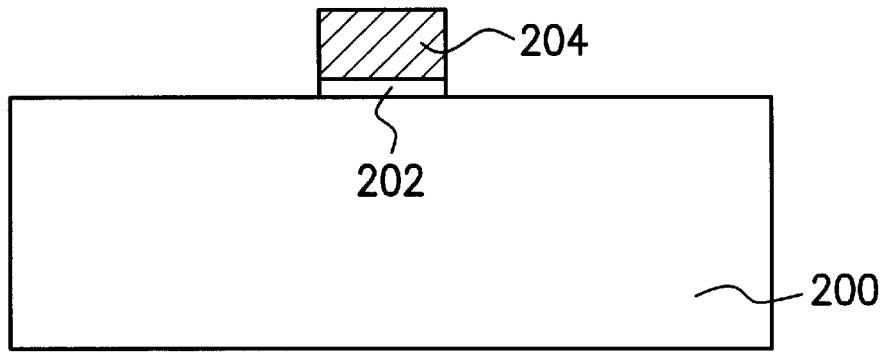
FIGS. 2A to 2J are cross-sectional views showing the process steps of one preferred embodiment of fabricating the MOSFET device.

Referring first to FIG. 2A, a gate oxide layer 202 and a gate 204 are formed on the substrate 200, wherein the gate oxide layer 202 is on the substrate 200, and the gate 204 is on the gate oxide layer 202.

Figure 2B:
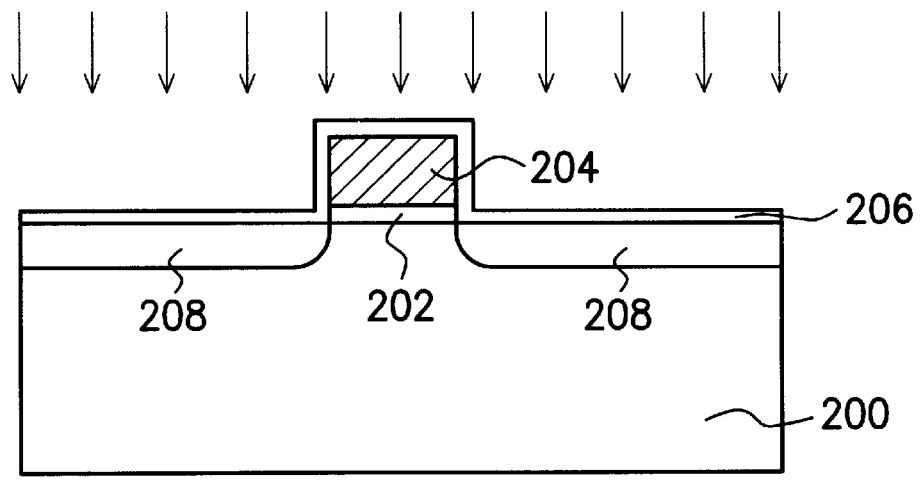

Referring to FIG. 2B, a liner oxide layer 206 is formed on the substrate 200 by thermal oxidation. Then, the substrate 200 is implanted by, for example, boron ions, phosphorus ions, or arsenic ions, to form a lightly doped region 208.

Figure 2C:
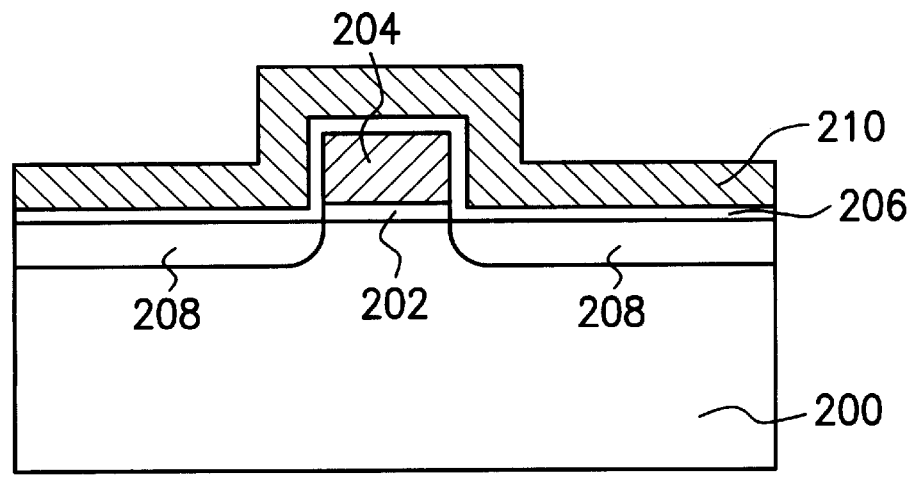

Referring to FIG. 2C, a conducting layer 210 is deposited on the gate 204 and the liner oxide layer 206 by CVD (chemical vapor deposition). The conducting layer 210 is, for example, polysilicon, amorphous silicon, or tungsten silicide. This process is used to increase the contact area of the gate 204 and the conducting layer 210 so that the resistance between them is lowered.

Figure 2D:
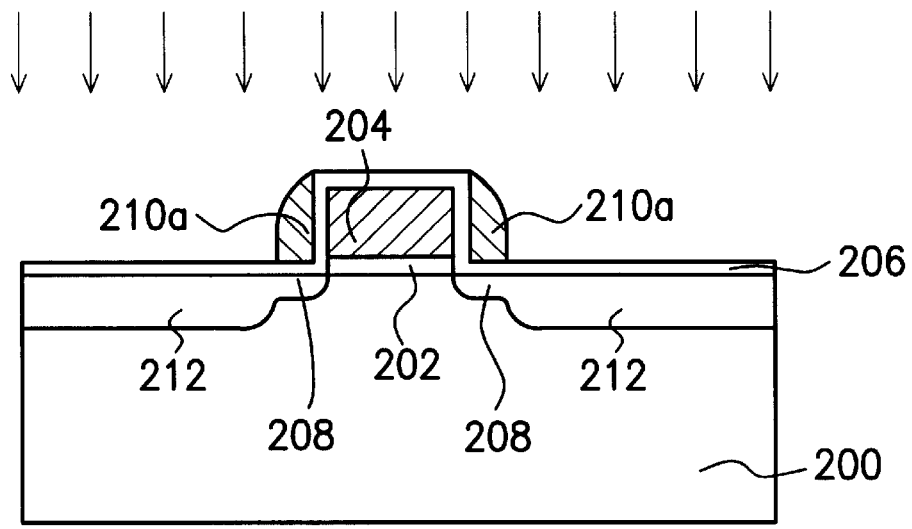

Referring to FIG. 2D, the conducting layer is dipped in HF etchant to form a first spacer 210a. Then, the substrate is further implanted by, for example, boron ions, phosphorus ions, or arsenic ions, to form a heavily doped region 212. The lightly doped region 208 and the heavily doped region 212 form the source/drain regions.

Figure 2E:
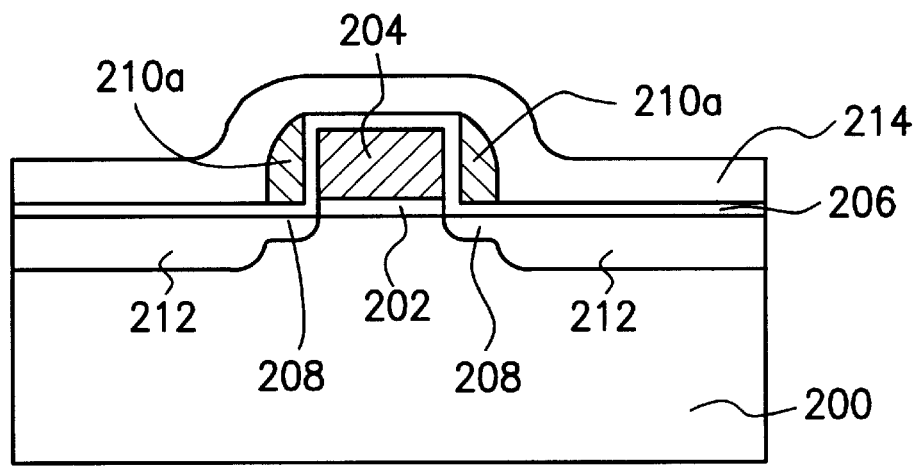

Referring to FIG. 2E, a dielectric layer 214 is formed over the liner oxide layer 206 and the first spacer 210a by CVD. The dielectric layer 214 is, for example, silicon oxide or silicon nitride. The existence of the first spacer 210a makes the distance between the dielectric layer 214 and the lightly doped region 208 farther than the conventional device. As a result, the gate-induced dual leakage decreases.

Figure 2F:
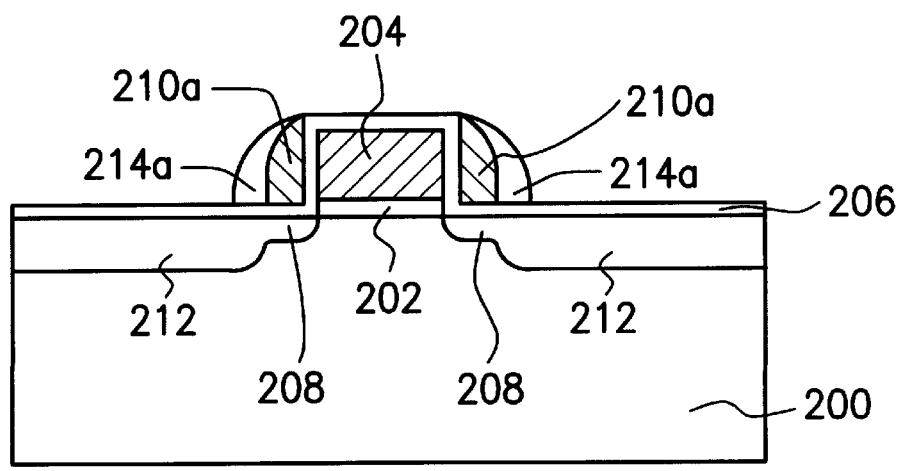
Figure 2G:
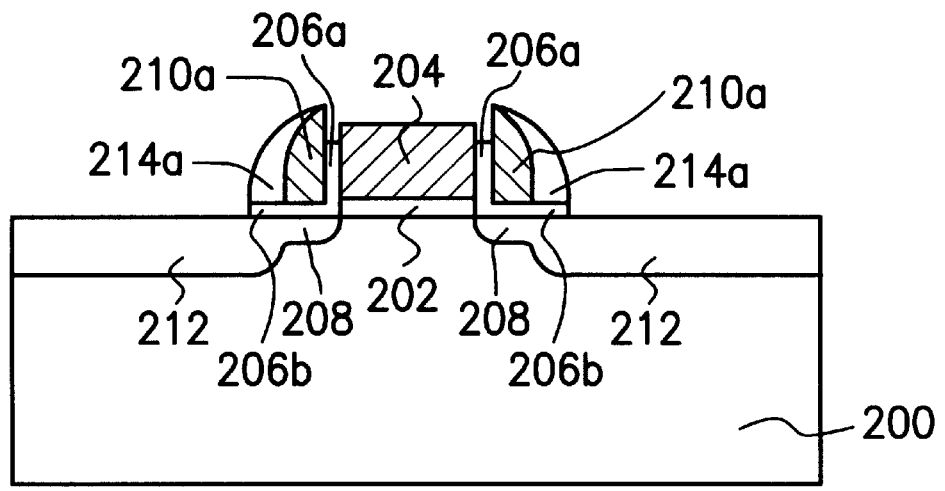

Referring to FIG. 2F, the dielectric layer 214 is dipped in HF etchant to form a second spacer 214a. As shown in FIG. 2G, the liner oxide layer 206 is etched to form a first structure 206a and a second structure 206b. The top of the first structure 206a is lower than the top of the gate 204 to expose part of the side walls of the gate 204, and the second structure 206b is connected to the second spacer 214a.

Figure 2H:
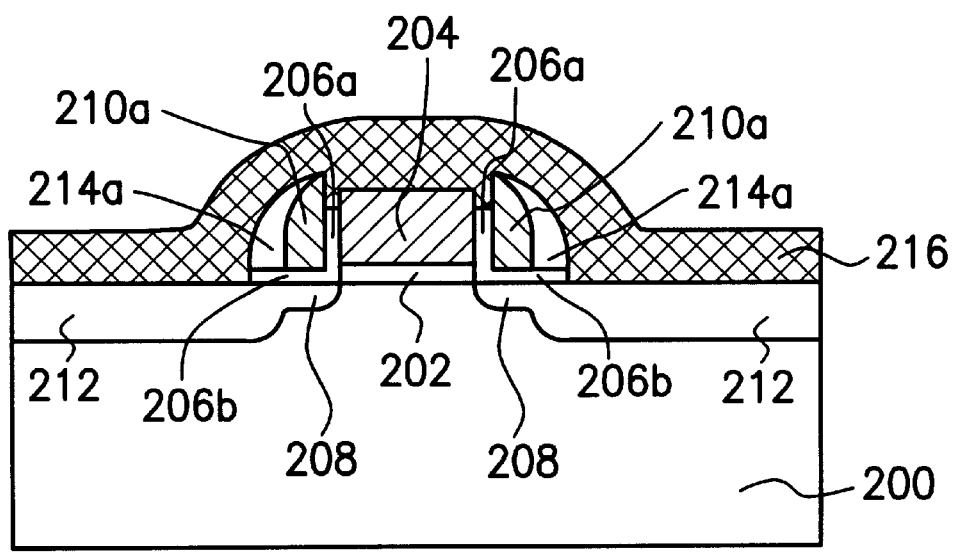
Figure 2I:
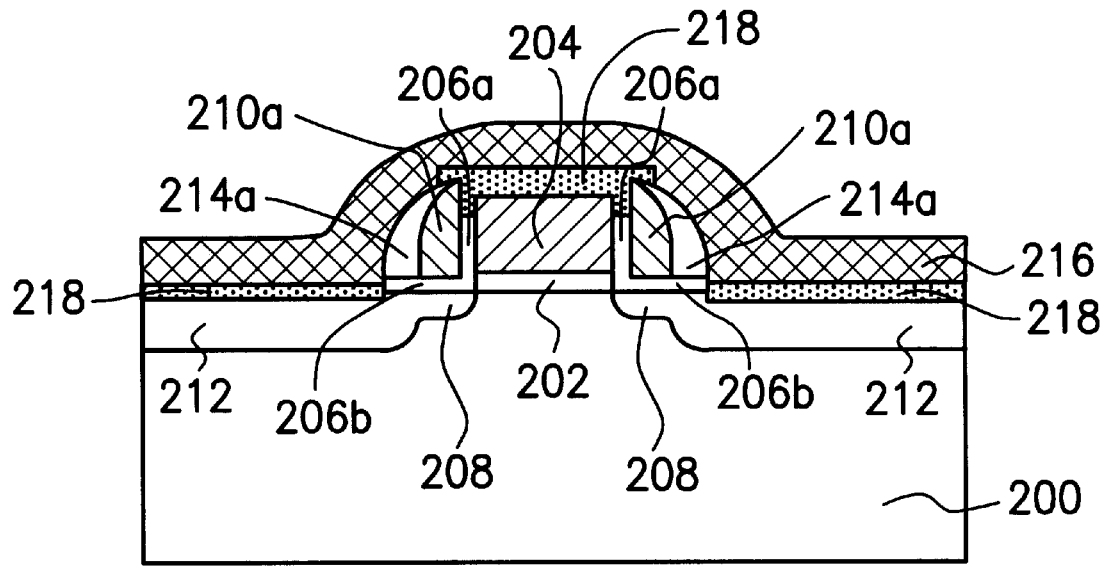
Figure 2J:
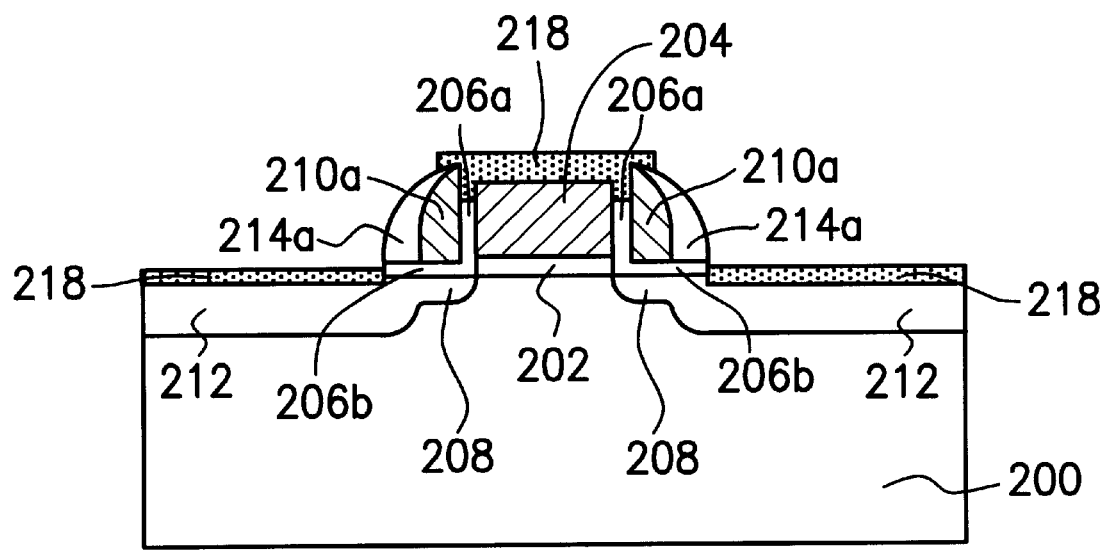

Referring to FIG. 2H, a metal layer, for example, a titanium layer 216, is formed on the substrate 200 by CVD or by sputtering. As shown in FIG. 2I, a titanium silicide layer 218 is formed on the substrate 200 by a self-aligned process. For example, the titanium silicide layer 218 is formed in the junction between both the gate 204, the substrate 200 and the titanium layer 216 by rapid thermal processing (RTP). In accordance with the embodiment, the contact area between the gate 204 and the titanium layer 216 is larger than the conventional one. Finally, as shown in FIG. 2J, the remainder of the titanium layer 216 is removed by dipping in HF.

In accordance with the first characteristic of the invention, the MOSFET device includes a first spacer and a second spacer, wherein first spacer is polysilicon, amorphous silicon, or tungsten silicide and the second spacer is silicon oxide or silicon nitride. The first spacer is used to increase the silicidation area on the gate.

In accordance with the second characteristic of the invention, when a gate voltage is applied, an ultra-shallow junction is created under the first spacer to reduce the source/drain resistance.

In accordance with the third characteristic of the invention, the second spacer is used to increase the distance between the titanium silicide layer and the junction interface.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a MOSFET device, comprising the sequential steps of:

providing a substrate, wherein a gate is on the substrate;

forming an oxide layer on the substrate, and implanting the substrate with first ions;

forming a first depositing layer;

etching the first depositing layer to form a first spacer, and implanting the substrate with second ions;

forming a second depositing layer;

etching the second depositing layer to form a second spacer alongside the first spacer;

etching the oxide layer to expose part of the side walls of the gate; and forming a metal silicide layer by a self-aligned process by depositing a metal layer so that the metal layer contacts said exposed part of the sidewall of the gate.

2. A method according to claim 1, wherein the oxide layer is formed by thermal oxidation.

3. A method according to claim 1, wherein the substrate is implanted with first ions to form a lightly doped region.

4. A method according to claim 1, wherein the first ions are boron ions.

5. A method according to claim 1, wherein the first ions are phosphorus ions.

6. A method according to claim 1, wherein the first ions are arsenic ions.

7. A method according to claim 1, wherein the first depositing layer is a conducting layer.

8. A method according to claim 1, wherein the first depositing layer is formed by CVD.

9. A method according to claim 1, wherein the first depositing layer is etched in HF etchant.

10. A method according to claim 1, wherein the first depositing layer is polysilicon.

11. A method according to claim 1, wherein the first depositing layer is amorphous silicon.

12. A method according to claim 1, wherein the first depositing layer is tungsten silicide.

13. A method according to claim 1, wherein the substrate is implanted with second ions to form a heavily doped region.

14. A method according to claim 1, wherein the second ions are boron ions.

15. A method according to claim 1, wherein the second ions are phosphorus ions.

16. A method according to claim 1, wherein the second ions are arsenic ions.

17. A method according to claim 1, wherein the second depositing layer is silicon nitride.

18. A method according to claim 1, wherein the second depositing layer is silicon oxide.

19. A method according to claim 1, wherein the second depositing layer is formed by CVD.

20. A method according to claim 1, wherein said step of forming the silicide comprises:

depositing the metal layer on the substrate;

forming the metal silicide layer by rapid thermal processing; and removing the metal layer.

21. A method according to claim 20, wherein the metal layer is titanium.

22. A method according to claim 20, wherein the metal layer is formed by sputtering.

23. A method according to claim 20, wherein the metal silicide layer is titanium silicide.

24. A method according to claim 1, wherein the metal layer is removed in HF etchant.

* * * * *